(12) United States Patent
Snaddon et al.

(10) Patent No.: US 6,768,293 B2
(45) Date of Patent: Jul. 27, 2004

(54) DISPLAYING SIGNAL MEASUREMENTS WITHIN MULTIPLE RANGES OF A PARAMETER

(75) Inventors: Stuart Snaddon, Glasgow (GB); Robert Schuller, Edinburgh (GB); Roy Macnaughton, Edinburgh (GB)

(73) Assignee: Agilent Technologies, Inc., Palo Alto, CA (US)

( * ) Notice: Subject to any disclaimer, the term of this patent is extended or adjusted under 35 U.S.C. 154(b) by 25 days.

(21) Appl. No.: 09/997,729

(22) Filed: Nov. 30, 2001

(65) Prior Publication Data

US 2003/0102856 A1 Jun. 5, 2003

(51) Int. Cl.[7] .......................... G01N 27/00; G01R 23/02
(52) U.S. Cl. .................... 324/76.19; 324/76.39
(58) Field of Search ................. 324/76.19, 76.39, 324/76.42; 702/69, 67; 705/14; 345/764, 440.1, 440, 970, 771

(56) References Cited

U.S. PATENT DOCUMENTS

| 3,775,681 | A | * | 11/1973 | Konrad ..................... 324/76.68 |
| 6,054,984 | A | * | 4/2000 | Alexander .................. 345/771 |
| 6,137,283 | A | * | 10/2000 | Williams et al. .......... 324/76.12 |
| 6,262,728 | B1 | * | 7/2001 | Alexander ............... 345/440.1 |
| 6,263,289 | B1 | * | 7/2001 | Hassun et al. ................ 702/69 |
| 6,320,577 | B1 | * | 11/2001 | Alexander ............... 345/440.1 |
| 6,326,986 | B1 | * | 12/2001 | Alexander .................. 345/764 |
| 6,326,987 | B2 | * | 12/2001 | Alexander .................. 345/771 |
| 6,407,756 | B1 | * | 6/2002 | Sontag et al. ............... 345/771 |
| 6,522,345 | B1 | * | 2/2003 | Alexander .................. 345/771 |
| 6,559,868 | B2 | * | 5/2003 | Alexander et al. .......... 345/781 |
| 6,584,419 | B1 | * | 6/2003 | Alexander .................... 702/68 |

OTHER PUBLICATIONS

Josef Wolf, Measurement of Adjacent Channel Leakage Power on 3GPP W–CDMA Signals with the ESP, Rhode & Schwarz; updated on 01/01.*

Rohde & Schwarz, Measurement of adjacent channel power on wideband CDMA signals, Oct. 12, 1998.*

Hilborn et al., An Adaptive Direct Conversion Transmitter, IEEE Transactions on vehicular technology, vol. 43, No. 2, pp. 223233, May 1994.*

Honkanen et al., Comparison of measured and simultaed PI/4–DQPSK adjacent channel power using a functional high power amplifier model, IEEE 1998, pp 2459–2463.*

* cited by examiner

Primary Examiner—Andrew H. Hirshfeld
Assistant Examiner—Wasseem H. Hamdan

(57) ABSTRACT

Measurements are obtained of a signal within each one of multiple ranges of a parameter. For each range a representative measurement value is derived together with the extent of the range. A respective graphical display element is defined for each range of the parameter, a first dimension of each display element (such as its height) being indicative of the representative measurement value for the respective range of the parameter, and a second dimension of the display element (such as its width) being indicative of the extent of that respective range of the parameter. A display of the measured signal throughout the multiple ranges of the parameter is generated, with the graphical display elements superimposed at positions corresponding to the respective ranges of the parameter.

7 Claims, 3 Drawing Sheets

DISPLAYING SIGNAL MEASUREMENTS WITHIN MULTIPLE RANGES OF A PARAMETER

TECHNICAL FIELD

This invention relates to methods for displaying signal measurements within multiple ranges of a parameter, and particularly though not exclusively to methods for displaying spectral power measurements.

BACKGROUND ART

Telecommunications equipment such as mobile telephones and cellular telephone base station transceivers are subject to a variety of checks and tests during manufacture to ensure that they are operating correctly and in conformity with applicable standards and regulations. One such test is the adjacent channel power (ACP) measurement, which measures the signal power levels in frequency channels that are adjacent to the transmission carrier or carriers (the reference carrier(s)) on which the equipment is intended to transmit. The ACP measurement typically uses a spectrum analyzer and involves sweeping through a range of frequencies around on the reference carrier, and determining the signal power at multiple points within a band centred on the carrier and containing the intended signal, and within adjacent bands offset either side of the carrier band. There may be for example six adjacent bands of each side of the carrier. The centre frequency and bandwidth of the carrier band and each adjacent band are usually specified in the relevant standard or regulation.

Conventionally the result of an ACP measurement has been presented as a graphical display of the signal spectrum (power versus frequency) within the overall frequency range of the measurement, as shown in FIG. 1. The upper and lower frequencies of the carrier band and of the offset bands are marked on the display, and the signal power within each band is indicated numerically adjacent the graphical display, e.g. beneath it. This approach leads to a very cluttered display, especially for larger numbers of adjacent bands, and can be extremely unintuitive and misleading in the case where the adjacent bands overlap. Associating frequency offsets with the respective calculated results is time-consuming and prone to error, as these items are located in separate areas of the display.

Another approach to the display of ACP measurements is to use a bar graph display which displays the carrier and each offset band as a respective one of several equal-width vertical bars, the height of the bars being indicative of the amplitude of the measured powers, as shown in FIG. 2. It is very difficult to adjust the analyser settings with this display, as there is virtually no visual feedback which would enable checks to be made of aspects such as correct relationship of frequency settings and absence of unintended channel overlap. The display is also readily but often incorrectly interpreted as indicating that all offset bands are of equivalent span and spacing.

DISCLOSURE OF INVENTION

According to one aspect of this invention there is provided a method of generating a display of a signal measurement within each of multiple ranges of a parameter (such as frequency), comprising the steps of:

obtaining measurements of a signal within each one of multiple ranges of a parameter;

deriving for each of said multiple ranges of the parameter:
a representative measurement value and
an extent of the range;

defining a respective graphical display element for each of said multiple ranges of the parameter, a first dimension of each display element being indicative of the representative measurement value for the respective range of the parameter, and a second dimension of the display element being indicative of the extent of that respective range of the parameter; and generating a display of the measured signal throughout the multiple ranges of the parameter, with the graphical display elements superimposed at positions corresponding to the respective ranges of the parameter.

Thus in the case of an adjacent power measurement, the display may comprise a trace of the measured signal power throughout frequency channels adjacent a reference (carrier) channel, with a vertical bar superimposed for each adjacent frequency channel, each bar having a width corresponding to the bandwidth of the respective adjacent channel and a height indicative of the power measured within that channel.

If desired the measurement value for each channel may also be indicated numerically in proximity to that channel, for example above it.

BRIEF DESCRIPTION OF DRAWINGS

A method and apparatus in accordance with this invention, for displaying the results of adjacent channel power measurements, will now be described, by way of example, with reference to the accompanying drawings, in which.

BEST MODE FOR CARRYING OUT THE INVENTION, & INDUSTRIAL APPLICABILITY

Figure 1:
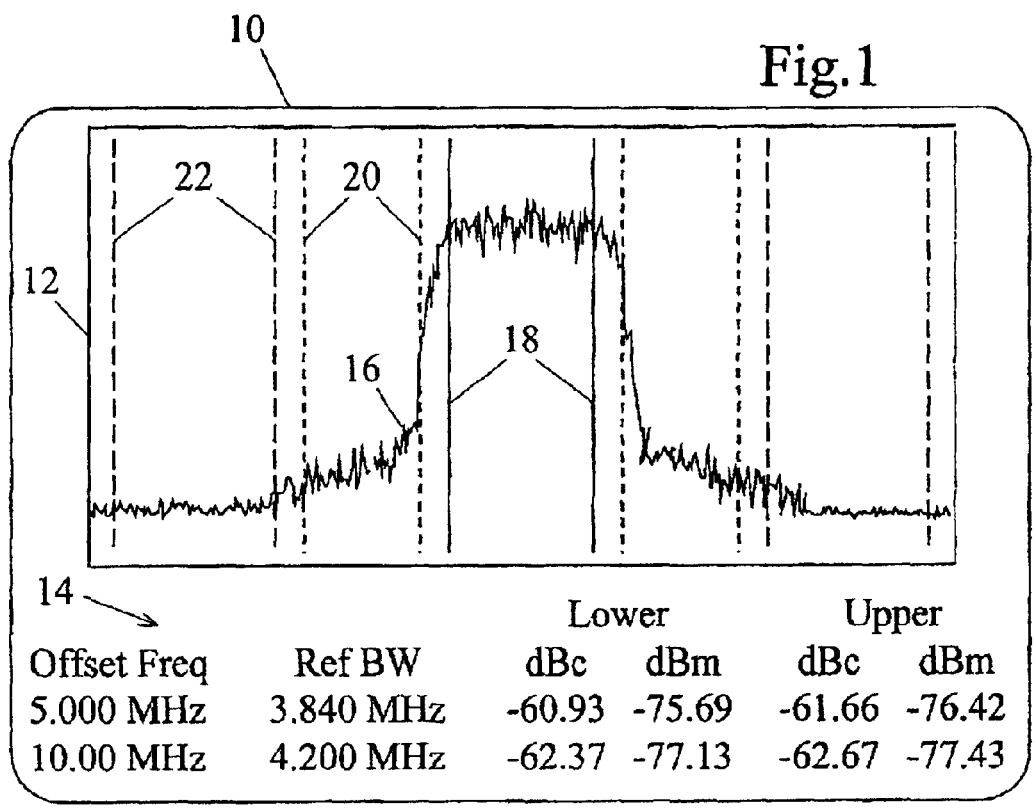
FIG. 1 shows one known form of representation of an ACP measurement, involving display of a signal spectrum.

Referring to FIG. 1, a conventional display 10 of ACP measurements made by a spectrum analyzer comprises a graphical portion 12 and a text portion 14. The graphical portion 12 contains a spectrum display 16, showing the variation of signal power (in the vertical dimension) emitted by a unit under test (WT) as a function of frequency (in the horizontal dimension). The bandwidth of a carrier or reference channel which contains the desired signal emissions from the UUT is indicated by first markers 18. Additional markers 20 and 22 indicate the bandwidths of adjacent frequency channels in which power measurements are being made, typically set by the instrument user in accordance with test specifications laid down in standards or regulatory documents. The markers for different frequency offsets above and below the reference channel are shown with different line types in the drawing; in an actual instrument other display characteristics, such as colour, may also be used.

The display's text portion 14 contains summary information about the adjacent frequency channels, such as the frequency offset between the centre frequency of each channel and that of the carrier channel, the bandwidth of the adjacent channels, and the power measured in each lower and upper offset frequency band, relative to the power in the carrier channel (dBc) and in absolute terms (dBm). The display may provide other information (not shown), such as the carrier channel centre frequency, bandwidth and measured power, and parameters of the measurement process.

As explained above, is display suffers from various limitations, especially when measured frequency channels overlap, and in particular extracting useful information about the measurements can be time consuming and liable to error.

Figure 2:
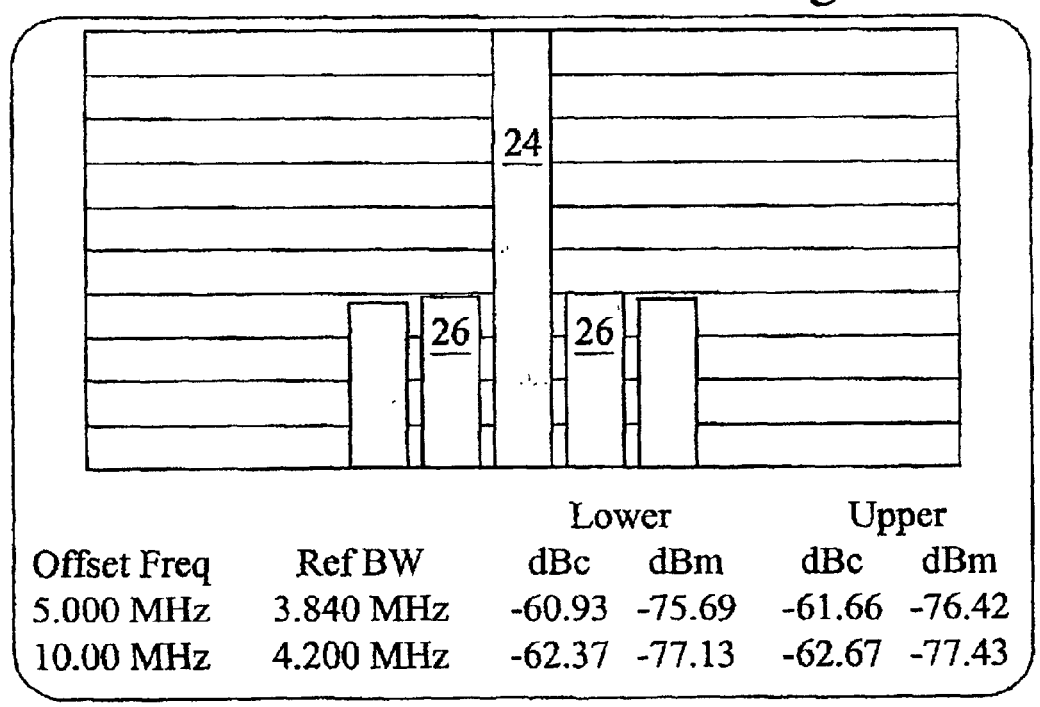
FIG. 2 shows another known form of representation of an ACP measurement, involving display of a bar graph.

Another conventional display of ACP measurements is shown in FIG. 2. Referring to FIG. 2, each frequency band is represented by a vertical bar, with a central bar 24 corresponding to the carrier channel. The height of each bar 26 representing an adjacent channel is set, relative to the height of the bar 24, to indicate the power in that adjacent channel relative to the power in the carrier channel. All the bars have the same width. A text portion below the bar display provides similar information to that described with reference to FIG. 1.

This display can be seriously misleading, as it tends to suggest that all measured frequency channels have the same bandwidth and spacing, which may well not be the case. Also the display changes only slightly as instrument settings are changed, providing very little visual feedback to the user to assist in making such changes.

Figure 3:
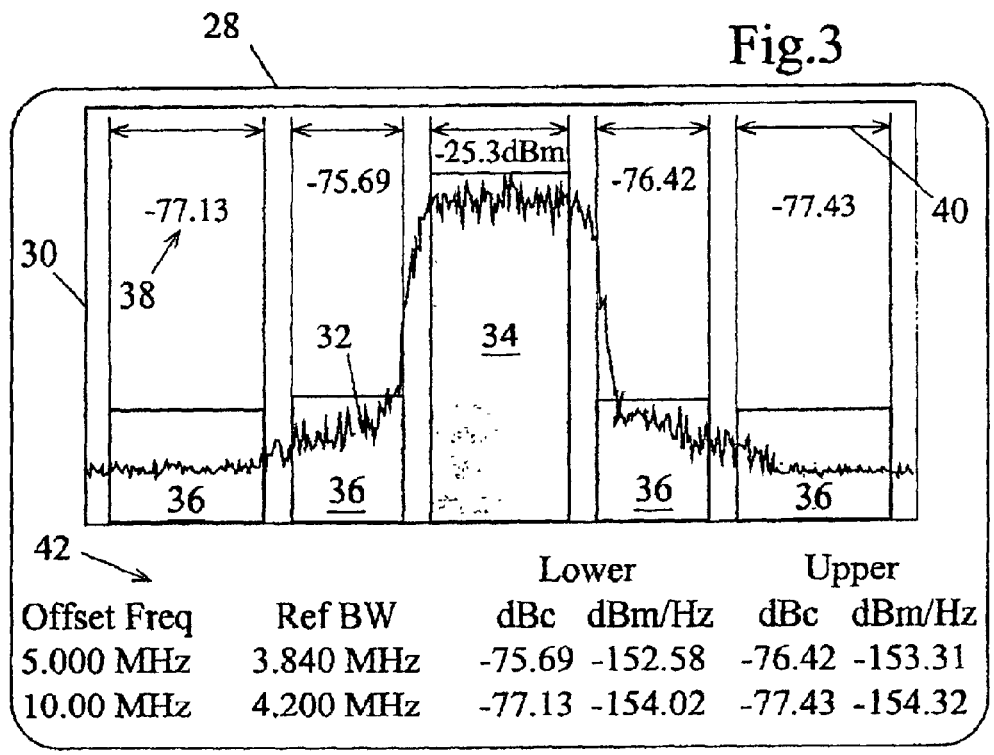
FIG. 3 shows a display of an ACP measurement in accordance with this invention.

FIG. 3 shows a display 28 in accordance with the present invention which alleviates these problems. Referring to FIG. 3, a graphical portion 30 of the display has a spectrum display 32 showing the variation of signal power as a function of frequency. The frequency and bandwidth of the carrier channel and the adjacent channels being measured are indicated by vertical bars 34 and 36. The height of each bar 36 relative to the bar 34 is indicative of the power level measured in the corresponding adjacent channel relative to the power in the carrier channel. The relative widths of all the bars 34 and 36 are indicative of the relative bandwidths of the corresponding carrier or adjacent channels.

The power level measured in each channel is also shown numerically above the corresponding bar as indicated at 38. The vertical position of each numerical value is controlled so that values for channels progressively further away from the carrier channel are progressively lower down the display 28, thus creating a cascade or staircase effect outwards and downwards from the value for the carrier channel. The relationship between the numerical value and the associated bar is emphasised by an arrow 40 identifying the extent of the frequency band. This together with the cascaded presentation of the numerical values assists the user to correlate values with channels, especially in the case where the bandwidths of channels overlap.

If desired another graphical characteristic of the bars, such as colour, may be controlled to indicate whether the power level measured in each bar conforms to defined or expected limits.

A text portion 42 of the display provides additional information on the measurement parameters and results. As the overall channel power measurements are indicated directly in association with the measured channels, this portion of the display can conveniently be used to indicate other measurement results as specified by the user, such as power spectral density (dB/Hz).

Figure 4:
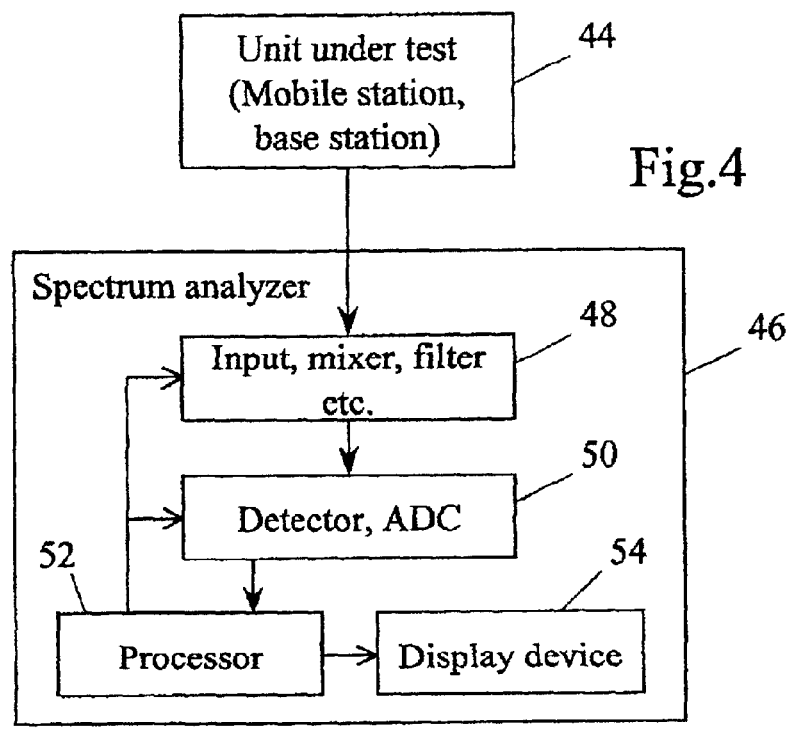
FIG. 4 is a simplified block schematic diagram of a test rig including a spectrum analyzer for performing an ACP measurement.
Figure 5:
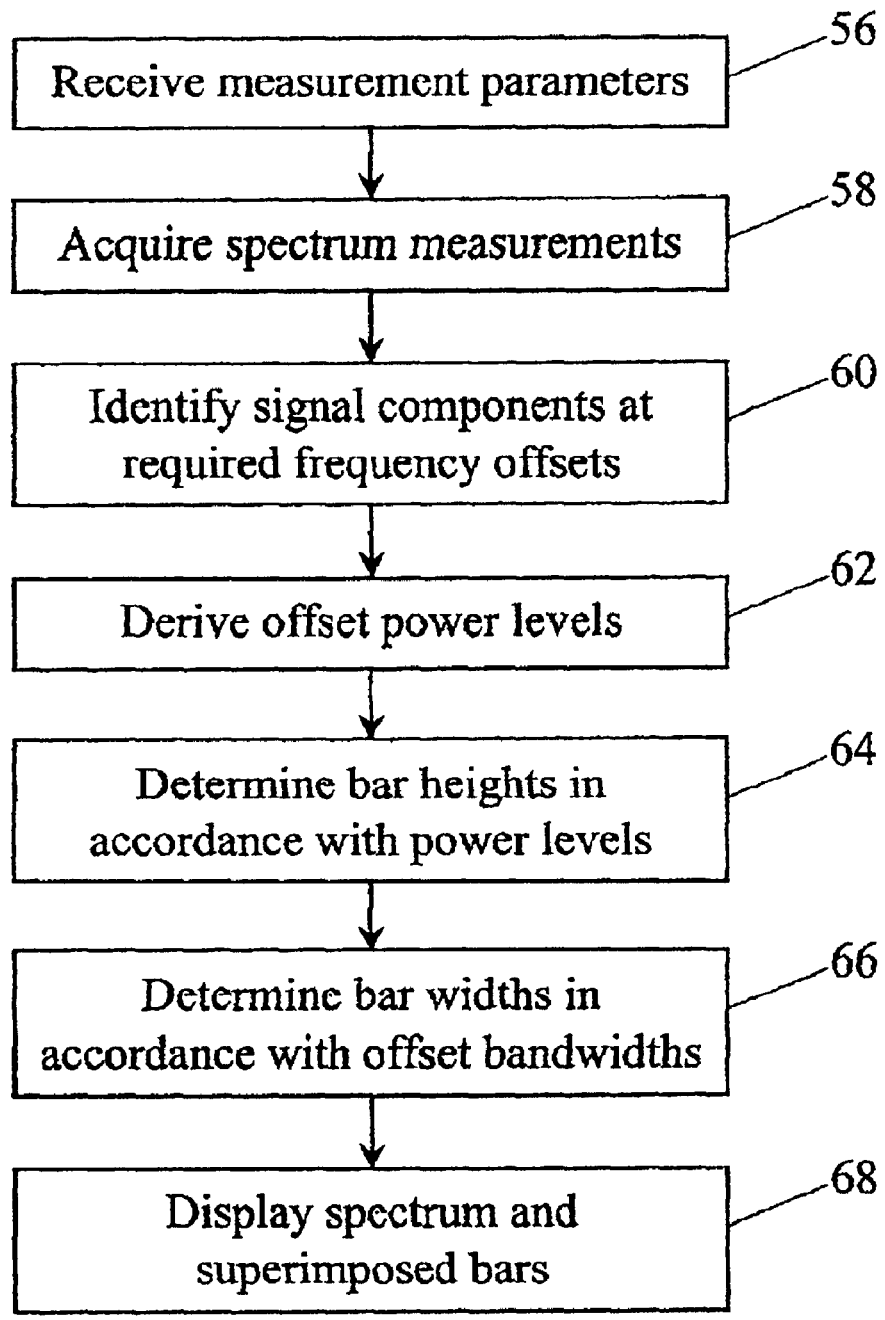
FIG. 5 shows a procedure for implementing the present invention.

The invention may be used, for example, in the context of the test setup shown in FIG. 4. Referring to FIG. 4, a UUT 44, such as a mobile telephone or a cellular telephone base station, is coupled for testing to a spectrum analyzer 46. The analyzer's measurement circuitry is conventional, comprising an input, mixer, filter and related components 48, and a detector and analogue-to-digital converter 50, and need not be described in detail here. The operation of this circuitry is coordinated by a processor 52 which also operates a display device 54 to provide the display described above with reference to FIG. 3, To this end the processor 52 implements the procedure shown in FIG. 5, in accordance with software or firmware program instructions stored in memory (not shown) associated with the processor. Referring to FIG. 5, at step 56 the parameters of the required measurement are received by the processor 52, for example via a control panel in response to user selections. At step 58 the processor 52 controls the analyzer circuitry 48 and 50 to acquire the desired measurements. At step 60 the processor analyzes the measurements to identify the signal components within each frequency channel of interest, and at step 62 the power levels of these signal components are derived. At step 64 the vertical extent of each bar 36 to be included in the display is determined, in accordance with the measured power level in each offset channel relative to the reference channel and the intended vertical extent of the bar 34. At step 66 the width of each bar 36 is determined, in accordance with the bandwidth of the corresponding channel and the display width selected for the reference channel bar 34. The vertical extent and width of the bar 34 are determined, for example, in accordance with the amount of display area available for the display 28, the number of frequency channels included in the measurement (and thus bars to be displayed), and the extent of other information to be presented in the display. Finally, at step 68, the required display is presented on the display device 54. The display may be assembled, for example, by depicting the frequency spectrum display or trace 32, adding vertical markers and arrows 40 to indicate the extent of each frequency channel, adding the bars with the determined heights and widths and of appropriate colours, and adding the cascaded numerical values 38.

Although the invention has been described for convenience in the context of spectrum analyzer measurements, and more specifically adjacent channel power measurements, the invention may also be applied in other circumstances where it is desired to display measurements of a signal within each of multiple ranges of a parameter.

What is claimed is:

1. A method of generating a display of a signal measurement within each of multiple ranges of a parameter, comprising the steps of:

obtaining measurements of a signal within each one of multiple ranges of a parameter;

deriving for each of said multiple ranges of the parameter:
a representative measurement value and
an extent of the range;

defining a respective graphical display element for each of said multiple ranges of the parameter, a first dimension of each graphical display element being indicative of the representative measurement value for the respective range of the parameter, and a second dimension of the graphical display element being indicative of the extent of that respective range of the parameter; and generating a display of the measured signal throughout the multiple ranges of the parameter, with the graphical display elements superimposed at positions corresponding to the respective ranges of the parameter, and wherein the signal measurement is an adjacent power measurement, and the display comprises a trace of measured signal power throughout frequency channels adjacent a reference channel, with a vertical bar superimposed for each adjacent frequency channel, each bar having a width corresponding to the bandwidth of the respective adjacent channel and a height indicative of the power measured within that channel.

2. The method of claim 1, wherein the measurement value for each channel is indicated numerically in proximity to that channel.

3. The method of claim 1, wherein the measurement value for each channel is indicated numerically above that channel.

4. The method of claim 3, wherein the numerical value for each channel is located on the display at a level displaced from the value for the reference channel by an amount related to the frequency offset of that channel from the reference channel.

5. The method of claim 1, wherein a display characteristic of the graphical display element is modified to indicate a property of the measurement value for the respective range of the parameter.

6. The method of claim 5, wherein the display characteristic is the colour of the display.

7. A measurement apparatus for generating a display of a signal measurement within each of multiple ranges of a parameter, comprising:

a detector that obtains measurements of the signal; and a processor that
  derives for each of said multiple ranges of the parameter:
    a representative measurement value and
    an extent of the range,
  defines a respective graphical display element for each of said multiple ranges of the parameter, a first dimension of each display element being indicative of the representative measurement value for the respective range of the parameter, and a second dimension of the display element being indicative of the extent of that respective range of the parameter, and
  generates for presentation on a display device a display of the measured signal throughout the multiple ranges of the parameter, with the graphical display elements superimposed at positions corresponding to the respective ranges of the parameter, and wherein the signal measurement is an adjacent power measurement, and the display comprises a trace of measured signal power throughout frequency channels adjacent a reference channel, with a vertical bar superimposed for each adjacent frequency channel, each bar having a width corresponding to the bandwidth of the respective adjacent channel and a height indicative of the power measured within that channel.

* * * * *

UNITED STATES PATENT AND TRADEMARK OFFICE
CERTIFICATE OF CORRECTION

PATENT NO. : 6,768,293 B2  Page 1 of 1
DATED : July 27, 2004
INVENTOR(S) : Stuart Snaddon, Roy Schuller and Roy Macnaughton It is certified that error appears in the above-identified patent and that said Letters Patent is hereby corrected as shown below:

Title page,
Item [75], Inventor, delete "Robert Schuller" should read -- Roy Schuller --.

Signed and Sealed this

Eighth Day of February, 2005

JON W. DUDAS
*Director of the United States Patent and Trademark Office*